United States Patent
Shue et al.

(10) Patent No.: US 6,610,592 B1
(45) Date of Patent: Aug. 26, 2003

(54) METHOD FOR INTEGRATING LOW-K MATERIALS IN SEMICONDUCTOR FABRICATION

(75) Inventors: Shau-Lin Shue, Hsinchu (TW); Ming-Hsin Tsai, Hsinchu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/557,395

(22) Filed: Apr. 24, 2000

(51) Int. Cl.[7] ........................................... H01L 21/4763
(52) U.S. Cl. ..................... 438/623; 438/631; 438/637; 438/638; 438/780
(58) Field of Search .............................. 438/622, 623, 438/625, 626, 627, 628, 629, 631, 633, 637, 638, 639, 640, 780, 926; 257/758, 759, 762, 774, 775

(56) References Cited

U.S. PATENT DOCUMENTS

| | | | |
|---|---|---|---|
| 5,110,712 A | | 5/1992 | Kessler et al. ............... 430/312 |
| 5,266,446 A | * | 11/1993 | Chang et al. ............... 430/314 |
| 5,602,423 A | | 2/1997 | Jain ........................... 257/752 |
| 5,625,232 A | * | 4/1997 | Numata et al. ............. 157/758 |
| 5,744,394 A | | 4/1998 | Iguchi et al. ............... 438/276 |
| 5,827,776 A | | 10/1998 | Bandyopadhyay et al. . 438/624 |
| 6,008,540 A | * | 12/1999 | Lu et al. ..................... 257/758 |
| 6,163,075 A | * | 12/2000 | Okushima .................. 257/759 |
| 6,211,070 B1 | * | 4/2001 | Iwasaki et al. ............. 438/637 |
| 6,346,474 B1 | * | 2/2002 | Liu ............................. 438/633 |
| 6,452,274 B1 | * | 9/2002 | Hasegawa et al. ......... 257/758 |

FOREIGN PATENT DOCUMENTS

JP          10199882        *  7/1998

* cited by examiner

Primary Examiner—Wael Fahmy
Assistant Examiner—Thanhha Pham
(74) Attorney, Agent, or Firm—George O. Saile; Stephen B. Ackerman

(57) ABSTRACT

A method for integrating low-K materials in semiconductor fabrication. The process begins by providing a semiconductor structure having a dielectric layer thereover, wherein the dielectric layer comprising an organic low-K material. The dielectric layer is patterned to form pillar openings. A pillar layer is deposited over the semiconductor structure; thereby filling the pillar openings with the pillar layer. The pillar layer is planarized to form pillars embedded in said dielectric layer. The pillar layer comprises a material having good thermal stability, good structural strength, and good bondability of spin coating back-end materials, improving the manufacturability of organic, low-K dielectrics in semiconductor fabrication. In one embodiment, the pillars are formed prior to forming dual damascene interlayer contacts. In another embodiment, pillars are formed simultaneously with interlayer contacts.

12 Claims, 4 Drawing Sheets

METHOD FOR INTEGRATING LOW-K MATERIALS IN SEMICONDUCTOR FABRICATION

BACKGROUND OF INVENTION

1) Field of the Invention

This invention relates generally to fabrication of a semiconductor device and more particularly to a method for forming a low-k dielectric layers with improved thermal stability and structural strength by forming pillars, comprising material with good thermal stability and structural strength within the low-K dielectric layer.

2) Description of the Prior Art

Integrated circuits continue to increase in complexity each year. As applications develop for memories, microprocessors, and minicomputers there is an increasing demand for greater microminiaturization. The shrinking design rule for ULSI circuits has led to increased interconnection delay caused by parasitic capacitance of interconnection wiring. One way to reduce the interconnection delay is to reduce the dielectric constant of the dielectric layer between the device layer and the interconnect layer, or the interlayer dielectric (ILD). A great deal of work has been aimed at developing organic polymers for use as interlayer dielectrics because their dielectric constants (K) are generally lower than those of inorganic materials. However, poor chemical stability, thermal stability and structural (mechanical) strength have hindered the widespread use of organic polymers as interlayer dielectrics in microelectronic fabrication.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,602,423 (Jain) shows damascene conductors with embedded pillars to prevent erosion during chemical-mechanical polishing.

U.S. Pat. No. 5,827,776 (Bandyopadhyay et al.) shows a multilevel interconnect structure using staggered interconnects to reduce electric field coupling between interconnect lines.

U.S. Pat. No. 5,110,712 (Kessler et al.) shows a metal interconnect in a polymer, low-K dielectric layer.

U.S. Pat. No. 5,744,394 (Iguchi et al.) shows a dual damascene process for forming interconnections.

However, none of these patents disclose or suggest combining a polymer, low-K dielectric layer with pillars comprising material with superior thermal stability and structural strength to overcome the processing limitations associated with using polymer, low-K dielectric layers.

SUMMARY OF THE INVENTION

It is an object of the present invention to provide a method for forming an organic, low-K dielectric layer having improved thermal stability.

It is another object of the present invention to provide a method for forming an organic, low-K dielectric layer having improved structural strength.

It is another object of the present invention to provide a method for forming an organic, low-K dielectric layer having improved bondability of spin coating back-end materials.

It is another object of the present invention to provide a method for forming an organic low-K dielectric layer with improved thermal stability, structural strength, and spin coating back-end material bondability by embedding pillars in the organic, low-K dielectric layer comprising a material with good thermal stability, structural strength, and bondability.

It is yet another object of the present invention to provide a producible and economical method for forming an organic, low-K dielectric layer in a semiconductor fabrication process.

To accomplish the above objectives, the present invention provides a method for integrating low-K materials in semiconductor fabrication. The process begins by providing a semiconductor structure having a dielectric layer thereover, wherein the dielectric layer comprising an organic low-K material. The dielectric layer is patterned to form pillar openings. A pillar layer is deposited over the semiconductor structure; thereby filling the pillar openings with the pillar layer. The pillar layer is planarized to form pillars embedded in said dielectric layer. The pillar layer comprises a material having good thermal stability, good structural strength, and good bondability of spin coating back-end materials, improving the manufacturability of organic, low-K dielectrics in semiconductor fabrication. In one embodiment, the pillars are formed prior to forming dual damascene interlayer contacts. In another embodiment, pillars are formed simultaneously with interlayer contacts.

The present invention provides considerable improvement over the prior art. Embedded pillars provide the thermal stability and structural strength necessary to make the use of organic, low-K dielectric layers practical, without reducing the dielectric properties of the organic, low-K dielectric layer. Also, the embedded pillars can provide good bondability of spin coating back-end materials.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numeral designate similar or corresponding elements, regions and portions and in which.

DETAILED DESCRIPTION OF THE INVENTION

The present invention will be described in detail with reference to the accompanying drawings. The present invention provides a method for forming an organic, low-K dielectric layer having improved thermal stability and structural strength by embedding pillars in the organic, low-K dielectric layer, comprising a material having good thermal stability and structural strength.

First Embodiment

Figure 1:
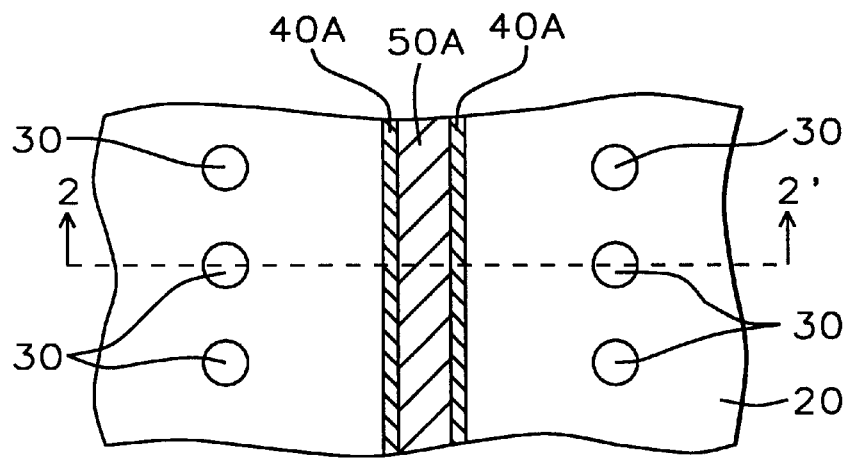
FIG. 1 shows a top view of a semiconductor device having an embedded pillar matrix formed within an organic, low-K dielectric layer according to a first embodiment of the present invention.

In a first embodiment of the present invention, as shown in FIGS. 1 through 6, pillars are formed in an organic, low-K dielectric layer prior to using a dual damascene process to form interconnects. As shown in FIG. 1, pillars (30) are embedded in an organic, low-K dielectric layer (20) between damascene contact structures (50A,40A). The damascene contact structures comprise a planarized contact (50A) and planarized underlying barrier layer.

Figure 2:
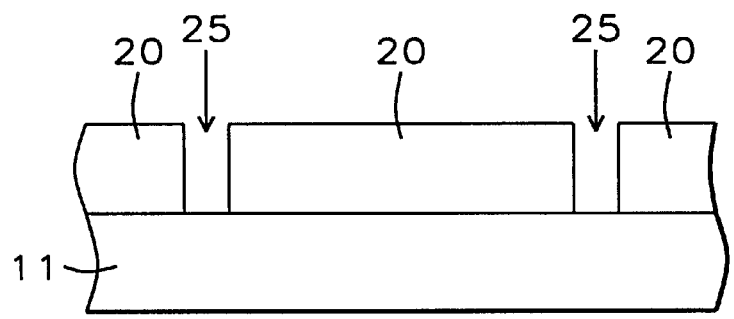
FIGS. 2 through 6 show sequential sectional views of a process for forming an organic, low-K dielectric layer with embedded pillars according to a first embodiment of the present invention. The cross-section for FIGS. 2 through 6 is taken generally along axis 2–2' shown on FIG. 1.

Referring to FIG. 2, the first embodiment of the present invention begins by providing a semiconductor structure (11) having a dielectric layer (20) thereover, wherein the dielectric layer comprises an organic, low-K dielectric material. Semiconductor structure (11) is understood to possibly include a substrate comprising a semiconducting material such as monocrystalline silicon or germanium or a silicon on insulator (SOI) structure as is known in the art. Semiconductor structure (11) is understood to possibly further include conductive layers and/or insulating layers formed over a substrate or the like, and passive and or active devices formed over and/or in the substrate or the like. The low-K dielectric layer (20) can comprise any of a number of advanced low-K materials including, but not limited to: aerogel, xerogel, nanoglass, Flare, amorphous $CF_x$, or Silk, JSR, Coral, and Black Diamond.

Still referring to FIG. 2, the low-K dielectric layer (20) is patterned to form pillar openings (25). The pillar openings can be formed using a lithography process and etch as is known in the art. The pillar openings (25) are preferably formed in a matrix pattern surrounding, but not over active areas of the semiconductor structure (11).

Figure 3:
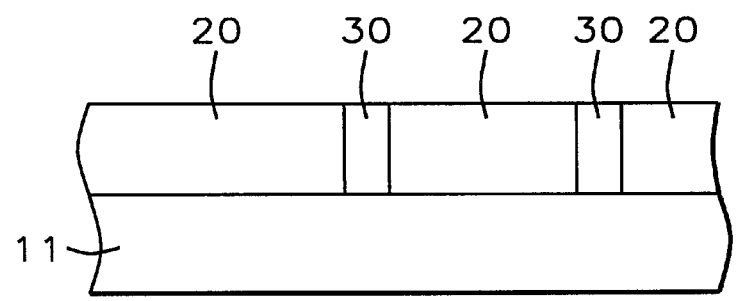

Referring to FIG. 3, a pillar layer is deposited over the semiconductor structure (11), filling the pillar openings (25). The pillar layer comprises a material having good thermal stability, good structural strength, and good bondability of spin coating back-end materials. Materials suitable for the pillar layer include, but are not limited to: silicon nitride, silicon carbide, carbon, amorphous carbon, tungsten, copper, and aluminum. The pillar layer can be deposited by various processes appropriate for the material chosen and known in the art, such as: chemical vapor deposition, sputtering, electroplating and most preferably C VD.

Still referring to FIG. 3, the pillar layer is planarized to form pillars (30), stopping on the low-K dielectric layer (20). The pillar layer is preferably planarized using a chemical-mechanical polishing process.

Figure 4:
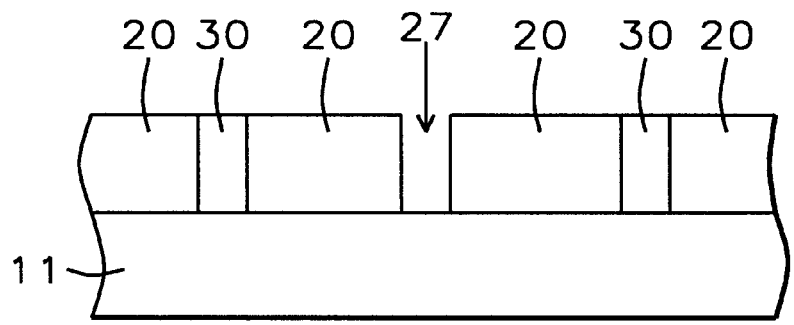

Referring to FIG. 4, the low-K dielectric layer (20) is patterned to form via openings (27). The via openings can be formed using a lithography process and etch as is known in the art. The via openings (27) are preferably formed over active areas of the semiconductor structure (11) to provide interconnections to interconnection layers.

Figure 5:
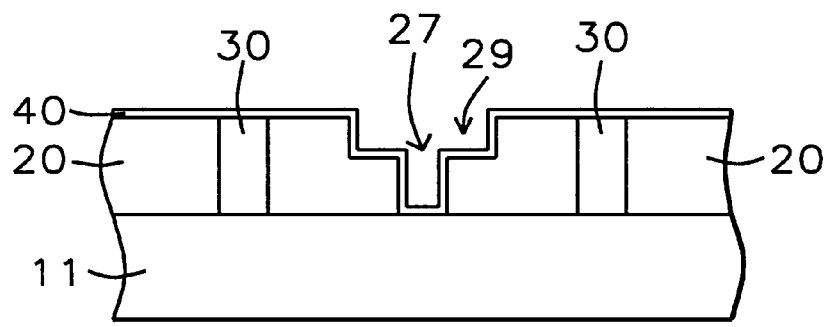

Referring to FIG. 5, the low-K dielectric layer (20) is patterned to form trench openings (29). The trench openings can be formed using a lithography process and etch as is known in the art. The trench openings (29) are formed over the via openings (27) such that they form interconnection patterns, connecting various via openings.

Still referring to FIG. 5, a barrier layer (40) is formed over the semiconductor structure (11) lining the bottoms and sidewalls of the via openings (27) and trench openings (29). The barrier layer preferably comprises tantalum nitride deposited using a sputtering process.

Figure 6:
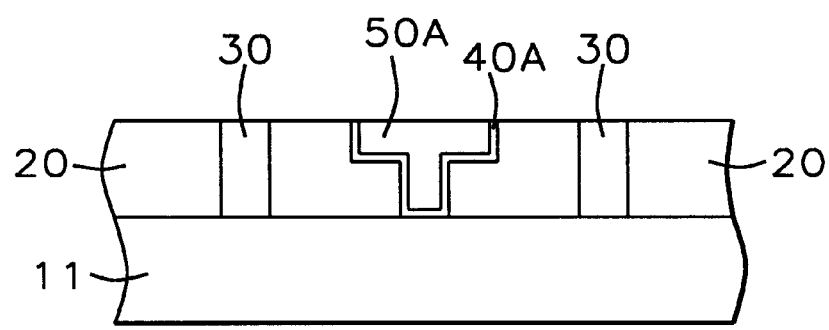

Referring to FIG. 6, an interconnect layer (50) is formed on the barrier layer (40). The interconnect layer preferably comprises copper deposited using a process such as electroplating, PVD, or CVD. The interconnect layer (50) and the barrier layer (40) are planarized, stopping on the low-K dielectric layer (20) to form an interconnect (50A) with an underlying planaraized barrier layer (40A). The interconnect layer and the barrier layer are preferably planarized using a chemical-mechanical polishing process. The interconnect (50A) can be a dual damascene interconnect or can be a combination of an interconnect and a conductive line. Alternatively, the interconnect (50A) can be formed between two conductive lines (e.g. metal lines) or between the semiconductor structure (11) and an overlying conductive line (e.g. poly-1 and metal-1).

Second Embodiment

Figure 7:
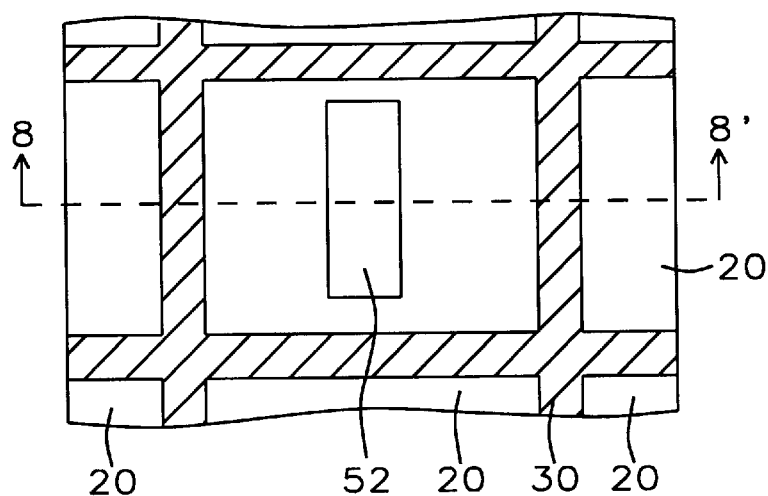
FIG. 7 shows a top view of a semiconductor device having an embedded pillar matrix formed within an organic, low-K dielectric layer according to a second embodiment of the present invention.

In a second embodiment of the present invention, as shown in FIGS. 7 through 11, pillars are formed in an organic, low-K dielectric layer simultaneously with formation of interlayer contacts for an interconnect layer. Referring to FIG. 7, pillars (30) are embedded in an organic, low-K dielectric layer (20) in a matrix pattern, surrounding an interconnect pattern (52) which overlies an active area of a semiconductor structure under the low-K dielectric layer.

Figure 8:
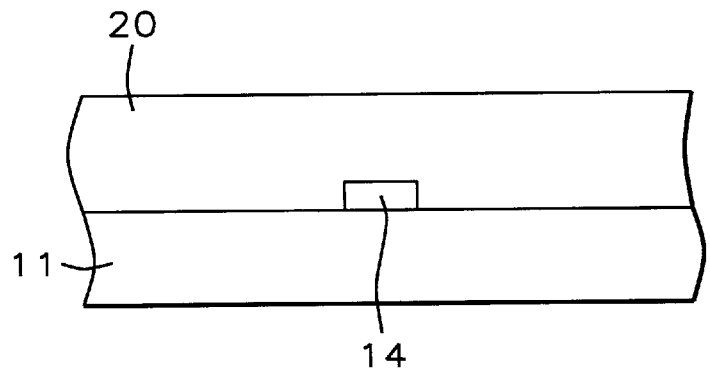
FIGS. 8 through 10 show sequential sectional views of a process for forming an organic, low-K dielectric layer with embedded pillars according to a second embodiment of the present invention. The cross-section for FIGS. 8 through 10 is taken generally along axis 8–8' shown on FIG. 7.

Referring to FIG. 8, the second embodiment of the present invention begins by providing a semiconductor structure (11) having a conductive structure (14) thereover. Semiconductor structure (11) is understood to possibly include a substrate comprising a semiconducting material such as monocrystalline silicon or germanium or a silicon on insulator (SOI) structure as is known in the art. Semiconductor structure (11) is understood to possibly further include conductive layers and/or insulating layers formed over a substrate or the like, and passive and or active devices formed over and/or in the substrate or the like. The conductive structure (14) can be any of several conductive structures known in the art, such as a gate, conductive line (e.g. metal line), a word line, or a bit line. The conductive structure (14) can be formed on the substrate, or on an ILD layer or an IMD layer overlying the substrate.

Still referring to FIG. 8, the semiconductor structure (11) and the conductive structure (14) have a dielectric layer (20) thereover, wherein the dielectric layer comprises an organic, low-K dielectric material. The low-K dielectric layer (20) can comprise any of a number of advanced low-K materials including, but not limited to: aerogel, xerogel, nanoglass, Flare, and amorphous $CF_x$.

Figure 9:
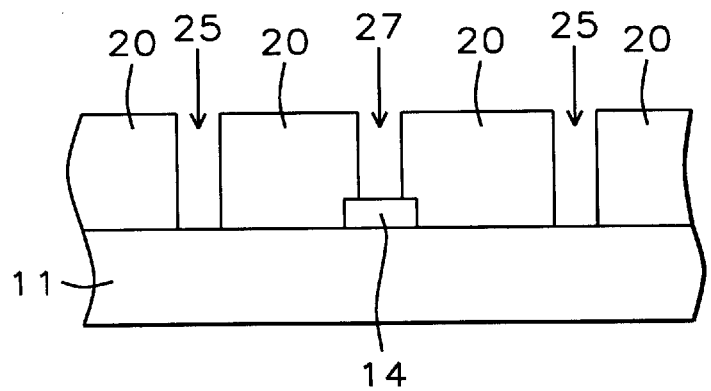

Referring to FIG. 9, the low-K dielectric layer (20) is patterned to form pillar openings (25) and via openings (27). The pillar openings and via openings can be formed using a lithography process and etch as is known in the art. The pillar openings (25) are preferably formed in a matrix pattern surrounding, but not over the conductive structures on the semiconductor structure (11). The via openings (27) are formed over the conductive structure (14).

Figure 10:
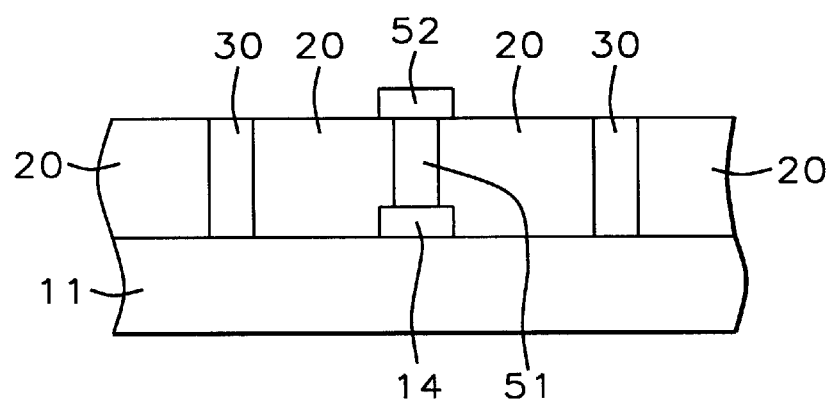

Referring to FIG. 10, a pillar and contact layer is deposited over the semiconductor structure (11), filling the pillar openings (25) and the via openings (27). The pillar and contact layer comprises a conductive material having good thermal stability, good structural strength, and good bondability of spin coating back-end materials. Materials suitable for the pillar and contact layer include, but are not limited to: tungsten, copper, and aluminum. The pillar and contact layer can be deposited by various processes appropriate for the material chosen and known in the art, such as: chemical vapor deposition, sputtering, electroplating and most preferably CVD.

Still referring to FIG. 10, the pillar and contact layer is planarized to form pillars (30) in the pillar openings and contacts (e.g. via plugs) (51) in the contact openings, stopping on the low-K dielectric layer (20). The pillar and contact layer is preferably planarized using a chemical-mechanical polishing process.

Still referring to FIG. 10, a interconnect pattern (52) is formed over the contacts (e.g. via plugs) (51), by depositing a conductive layer, then patterning the conductive layer to form an interconnect pattern. The conductive layer can be pattern using a lithography and etch process as is known in the art. The conductive layer preferably comprises a metal material suitable for semiconductor interconnects, such as copper or aluminum.

A key advantage of the present invention is that the embedded pillars provide the thermal stability and structural strength necessary to make the use of organic, low-K dielectric layers practical, without reducing the dielectric properties of the organic, low-K dielectric layer. Also, the embedded pillars can provide good bondability of spin coating back-end materials.

What is claimed is:

1. A method for integrating low-K dielectric materials in dual damascene interconnect semiconductor fabrication, comprising the steps of:
   a. providing a semiconductor structure having a dielectric layer thereover; said dielectric layer being comprised of a single homogeneous low-K material; said low-k material having a dielectric constant of less than about 3.2;
   b. patterning said dielectric layer to form a matrix of pillar openings together with via and interconnect openings within said low-k material; said matrix of pillar openings terminating on the surface of inactive areas of the semiconductor structure; said via openings terminating on the surface of active areas of the semiconductor structure; said interconnect openings being connected to the active areas of the semiconductor structure through said via openings;
   c. depositing a fill layer over said dielectric layer; thereby filling said matrix of openings together with said via and interconnect openings within said low-k dielectric with said fill layer; and
   d. planarizing said fill layer to form structural pillars together with vias and interconnect embedded in said low-k dielectric layer.

2. The method of claim 1 wherein said fill layer comprises a material selected from the group composed of: tungsten, copper and aluminum.

3. The method of claim 1 wherein said dielectric layer comprises a material selected from the group composed of: aerogel, xerogel, nanoglass, Flare, amorphous Cfx, Silk, JSR, Coral, and Black Diamond.

4. A method for integrating low-K dielectric materials in dual damascene interconnect semiconductor fabrication, comprising the sequential steps of:
   a. providing a semiconductor structure having a dielectric layer thereover; said dielectric layer comprising a single homogeneous low-K material; said low-k material having a dielectric constant of less than about 3.2;
   b. patterning said dielectric layer to form a matrix of pillar openings within said low-k material; said pillar openings terminating on the surface of inactive areas of the semiconductor structure;
   c. depositing a pillar fill layer over said matrix of pillar openings in the dielectric layer thereby filling said pillar openings within said low-k dielectric with said pillar layer;
   d. planarizing said pillar layer, stopping on said dielectric layer, to form pillars embedded in said low-k dielectric material;
   e. patterning said dielectric layer to form via openings and interconnect openings within said low-k material; said via opening terminating on the surface of active areas of the semiconductor structure; said interconnect opening being connected to the active areas of the semiconductor structure through said via openings;
   f. depositing an interconnect fill layer over said via and interconnect openings in said dielectric layer; thereby filling said via and interconnect openings within said low-k dielectric; and
   g. planarizing said interconnect fill layer, stopping on said low-K dielectric layer, to form interconnects embedded in said low-k dielectric material.

5. The method of claim 4 wherein said dielectric layer comprises a material selected from the group composed of: aerogel, xerogel, nanoglass, Flare, amorphous Cfx, Silk, JSR, Coral, and Black Diamond.

6. The method of claim 5 wherein said interconnect fill layer comprises a material selected from the group composed of: tungsten, copper and aluminum.

7. The method of claim 4 wherein said pillar fill layer comprises a material selected from the group composed of: silicon nitride, silicon carbide, amorphous carbon, carbon, tungsten, copper and aluminum.

8. The method of claim 4 wherein a barrier layer is formed over said semiconductor structure prior to depositing said interconnect layer.

9. A method for integrating low-K dielectric materials in semiconductor fabrication, comprising the steps of:
   a. providing a semiconductor structure having an active area and an inactive area thereon;
   b. forming conductive structures atop the semiconductor structure;
   c. depositing a dielectric atop said semiconductor structure and said conductive structures; said dielectric layer comprised of a single homogeneous low-K material; said low-k material having a dielectric constant of less than about 3.2;
   d. patterning said dielectric layer to form pillar openings and via openings; said via openings being over and terminated on the surface of the said conductive structures; said conductive structures said pillar openings terminated on the surface of the inactive area and forming a matrix pattern surrounding said conductive structures;

e. depositing a pillar and contact layer over said semiconductor structure; thereby filling said pillar openings and said via openings with said pillar and contact layer;

f. planarizing said pillar and contact layer to form pillars and contacts embedded in said dielectric layer; and g. forming an interconnect pattern over said contacts.

10. The method of claim 9 wherein said dielectric layer is comprised of a material selected from the group composed of: aerogel, xerogel, nanoglass, Flare, and amorphous CFx, Silk, JSR, Coral, and Black Diamond.

11. The method of claim 10 wherein said pillar layer is comprised of a material selected from the group composed of tungsten, copper and aluminum.

12. The method of claim 9 wherein said pillar and contact layer is comprised of a material selected from the group composed of: tungsten, copper and aluminum.

* * * * *